US012765186B2

(12) United States Patent
Shin et al.

(10) Patent No.: US 12,765,186 B2
(45) Date of Patent: Oct. 13, 2026

(54) DISPLAY DEVICE HAVING A PLURALITY OF CONDUCTIVE LAYERS

(71) Applicant: Samsung Display Co., LTD., Yongin-si (KR)

(72) Inventors: Hyun Eok Shin, Yongin-si (KR); Sang Gab Kim, Yongin-si (KR); Joon Yong Park, Yongin-si (KR); Do Keun Song, Yongin-si (KR); Su Kyoung Yang, Yongin-si (KR); Dong Min Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 543 days.

(21) Appl. No.: 18/362,812

(22) Filed: Jul. 31, 2023

(65) Prior Publication Data

US 2024/0121996 A1 Apr. 11, 2024

(30) Foreign Application Priority Data

Oct. 11, 2022 (KR) ........................ 10-2022-0130059
Jan. 30, 2023 (KR) ........................ 10-2023-0012069

(51) Int. Cl.
*H10K 59/123* (2023.01)
*H10D 86/40* (2025.01)
(Continued)

(52) U.S. Cl.
CPC ......... *H10K 59/123* (2023.02); *H10D 86/441* (2025.01); *H10D 86/60* (2025.01);
(Continued)

(58) Field of Classification Search
CPC ............. H01L 27/3293; H01L 51/0097; H01L 2251/5338; H01L 27/3276; H01L 27/156;
(Continued)

(56) References Cited

U.S. PATENT DOCUMENTS 8,729,796 B2 5/2014 Choi et al.
9,792,867 B2 * 10/2017 Ohishi .................. G02F 1/1345
(Continued)

FOREIGN PATENT DOCUMENTS

KR 10-2018-0128517 A 12/2018
KR 10-2021-0004795 A 1/2021
(Continued)

OTHER PUBLICATIONS

Extended European Search Report issued for corresponding application 23198013.7, on Feb. 2, 2024, 8 pages.

*Primary Examiner* — Caleb E Henry
(74) *Attorney, Agent, or Firm* — Womble Bond Dickinson (US) LLP

(57) ABSTRACT

A display device is provided. The display device includes a substrate including a display area and a pad area, which is disposed on one side of the display area, a plurality of conductive layers disposed on the substrate, in the display area and the pad area, a passivation layer disposed on the conductive layers, and a plurality of light-emitting elements disposed on the passivation layer, in the display area, and spaced apart from one another, wherein at least one of the conductive layers includes a first metal layer, a second metal layer, which is disposed on the first metal layer, and a third metal layer, which is disposed on the second metal layer, the first metal layer includes vanadium (V), the second metal layer includes aluminum (Al) or an Al alloy, and the third metal layer includes V or titanium (Ti).

20 Claims, 12 Drawing Sheets

(51) Int. Cl.
*H10D 86/60* (2025.01)
*H10K 59/121* (2023.01)
*H10K 102/00* (2023.01)
*H10K 102/20* (2023.01)

(52) U.S. Cl.
CPC ..... *H10K 59/1213* (2023.02); *H10K 2102/20* (2023.02); *H10K 2102/351* (2023.02)

(58) Field of Classification Search
CPC ..... H01L 27/1214; H01L 25/18; H01L 23/60; H01L 27/0248; Y02E 10/549; G09G 2300/026; G09G 2380/02; G09G 3/32; G09G 2300/0426; G09G 3/3208; G06F 3/147; G06F 3/1446; G06F 3/0412; G06F 3/04164; G06F 3/0443; G06F 2203/04107; G06F 2203/04111; G06F 2203/04103; G06F 3/041; H10K 59/18; H10K 77/111; H10K 2102/311; H10K 59/131; H10K 59/40; H10K 59/1213; H10K 59/1315; H10K 71/00; H10K 59/1201; H10K 50/844; H10K 59/121; H10K 59/123; H10K 2102/20; H10K 2102/351; G09F 9/301; G09F 9/33; H10D 86/441; H10D 86/451; H10D 86/60; H10H 29/142; H10H 20/01; H10H 20/857
See application file for complete search history.

(56) References Cited

U.S. PATENT DOCUMENTS 10,361,223 B2 * 7/2019 Kim ..................... H10D 89/911
10,503,297 B2 * 12/2019 Zeng ................... H04M 1/0266
10,575,403 B2 * 2/2020 Park ...................... G02F 1/1333
10,658,628 B2 * 5/2020 Lee ...................... H10K 59/873
10,896,946 B2 * 1/2021 Na ......................... H10D 86/60
11,355,568 B2 * 6/2022 Ka .......................... H10D 86/60
11,404,521 B2 * 8/2022 Moon .................. H10K 59/131
11,594,692 B2 * 2/2023 Choi .................... H10K 59/131
2007/0291042 A1 * 12/2007 Kwak .................. G09G 3/3688 345/535
2007/0296659 A1 * 12/2007 Kwak ................. G02F 1/13452 349/56
2013/0228867 A1 * 9/2013 Suematsu ............... H01L 23/60 257/355
2014/0117998 A1 * 5/2014 Hwang .................. G09G 3/006 324/511
2014/0217373 A1 * 8/2014 Youn .................... H05K 1/0281 438/23
2014/0217382 A1 * 8/2014 Kwon ................ H10K 50/8426 257/40
2014/0353670 A1 * 12/2014 Youn .................... H10K 77/111 438/586
2014/0376135 A1 * 12/2014 Huo ..................... H10D 89/711 361/56
2015/0036300 A1 * 2/2015 Park ....................... H05K 1/147 156/212
2015/0103500 A1 * 4/2015 Bae ........................ H05K 1/111 228/102
2015/0187800 A1 * 7/2015 Park ..................... H10D 86/423 257/43
2015/0270287 A1 * 9/2015 Kim ..................... H10D 86/441 257/40
2015/0380679 A1 * 12/2015 Fujiyoshi ............. H10K 59/873 438/26
2016/0044751 A1 * 2/2016 Ikeda ..................... H05B 33/02 362/227
2016/0172428 A1 * 6/2016 Song .................... H10K 59/131 257/40
2016/0174304 A1 * 6/2016 Kim ................... H10K 59/8792
2017/0025637 A1 * 1/2017 Kim ................... H10K 59/1213
2017/0069616 A1 * 3/2017 Cai ...................... H10D 84/135
2017/0179112 A1 * 6/2017 Narita .................. H10D 64/257
2018/0061917 A1 * 3/2018 Kim ................... H10K 59/8722
2018/0090702 A1 * 3/2018 Um ...................... H10K 77/111
2018/0301520 A1 * 10/2018 Jin ....................... H10D 86/441
2019/0179591 A1 * 6/2019 Kuo ...................... G06F 3/1446
2019/0281699 A1 * 9/2019 Bae ........................ H05K 1/111
2019/0346953 A1 * 11/2019 Peng ........................ G09G 3/20
2020/0067017 A1 * 2/2020 Seo ........................ H10K 77/10
2020/0075707 A1 * 3/2020 Ko ..................... H10K 59/1213
2020/0152723 A1 * 5/2020 Seo .................... H10K 59/1213
2020/0168684 A1 * 5/2020 Kim ..................... H10K 59/124
2020/0235196 A1 * 7/2020 Lee ...................... H10D 86/441
2020/0243638 A1 * 7/2020 Yang .................. H10K 59/1216
2020/0295047 A1 * 9/2020 Shin ....................... H10D 86/60
2020/0312236 A1 * 10/2020 Ma ....................... G09G 3/3225
2020/0343312 A1 * 10/2020 Ryu ................... H10K 59/8792
2020/0393936 A1 * 12/2020 Bok ...................... G06F 3/0448
2021/0091161 A1 * 3/2021 Baek .................... H10K 59/873
2021/0134910 A1 * 5/2021 Yang .................... H10D 86/441
2021/0226174 A1 * 7/2021 Kim ....................... H04N 23/57
2021/0273205 A1 * 9/2021 Lee ........................ H10K 50/82
2021/0343811 A1 11/2021 Kim et al.
2022/0045301 A1 * 2/2022 Jang ..................... H10K 59/122
2022/0157856 A1 * 5/2022 Choung ............... H10D 86/021
2022/0229514 A1 7/2022 Park
2023/0309280 A1 * 9/2023 Park .................. G02F 1/133305
2023/0317902 A1 * 10/2023 Lee ..................... H01L 25/0753 257/79

FOREIGN PATENT DOCUMENTS

KR 10-2021-0084835 A 7/2021
KR 10-2022-0001051 A 1/2022

* cited by examiner

TFT : ACT, GE, DE, SE
DP : PW1, PW2

TFT : ACT, GE, DE, SE
DP : PW1, PW2

TFT : ACT, GE, DE, SE
DP : PW1, PW2

DISPLAY DEVICE HAVING A PLURALITY OF CONDUCTIVE LAYERS

CROSS-REFERENCE TO RELATED APPLICATION

This application claims priority to and the benefit of Korean Patent Application Nos. 10-2022-0130059, filed on Oct. 11, 2022, and 10-2023-0012069, filed on Jan. 30, 2023, in the Korean Intellectual Property Office, the contents of both of which are incorporated herein by reference in their entireties.

BACKGROUND

1. Field

The present disclosure relates to a display device.

2. Description of the Related Art

As the information technology has developed, the demand for display devices for displaying images has diversified. For example, display devices have been applied to various electronic devices such as smart phones, digital cameras, notebook computers, navigation systems, and/or smart televisions. Here, the display devices may be flat panel display devices such as a liquid crystal display device, a field emission display (FED) device, and/or an organic light-emitting display device. Light-emitting display devices, among such flat panel display devices, include light-emitting elements capable of emitting light through the pixels of a display device, and can thus display an image without the need of a backlight unit for providing light to the display panel.

SUMMARY

Aspects of the present disclosure are directed toward a display device capable of preventing or reducing electrical defects that may be caused by the loss of wirings in a laser curing process performed during the manufacturing process.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a display device includes a substrate including a display area and a pad area on one side of the display area, a plurality of conductive layers on the substrate, and in the display area and the pad area, a passivation layer on the conductive layers, and a plurality of light-emitting elements on the passivation layer and in the display area, the plurality of light-emitting elements being spaced apart from one another, wherein at least one of the conductive layers includes a first metal layer, a second metal layer on the first metal layer, and a third metal layer on the second metal layer, the first metal layer includes vanadium (V), the second metal layer includes aluminum (Al) or an Al alloy, and the third metal layer includes V or titanium (Ti).

A thickness of the second metal layer may be greater than a thickness of the first metal layer and a thickness of the third metal layer, and the thickness of the first metal layer may be greater than the thickness of the third metal layer.

The thickness of the first metal layer may be from 1000 Å to half the thickness of the second metal layer.

The thickness of the second metal layer may be 2000 Å to 5000 Å, and the thickness of the first metal layer may be 1000 Å to 2500 Å.

The thickness of the third metal layer may be 1/10 the thickness of the second metal layer.

The thickness of the second metal layer may be 2000 Å to 5000 Å, and the thickness of the third metal layer may be 200 Å to 500 Å.

The thickness of the second metal layer may be 2000 Å to 5000 Å, the third metal layer may include Ti, and the thickness of the third metal layer may be 200 Å to 500 Å.

The at least one of the conductive layers may include a void between the first metal layer and the third metal layer due to removal of part of the second metal layer therefrom.

A width of the void may be 5.0 μm to 20.0 μm.

The second metal layer may include an aluminum (Al)-nickel (Ni)-lanthanum (La) alloy, and the Al—Ni—La alloy may have a total Ni—La content of 0.1 at % or less based on a total atomic composition of the Al—Ni—La alloy.

The display device may further comprise a first conductive layer on the substrate, a buffer layer on the first conductive layer, a semiconductor layer on the buffer layer, a gate insulating layer on the semiconductor layer, a second conductive layer on the gate insulating layer, an interlayer insulating layer on the second conductive layer, and a third conductive layer between the interlayer insulating layer and the passivation layer, wherein the first conductive layer may include the first, second, and third metal layers.

The second conductive layer may include the first, second, and third metal layers.

The third conductive layer may include a base layer including Ti, a middle layer on the base layer and including Al or an Al alloy, and an upper layer on the middle layer and including Ti.

The display device may further include a first pad wire in the pad area and in the same layer as the first conductive layer, and a second pad wire on the first pad wire and in the same layer as the second conductive layer.

At least one of the first pad wire or the second pad wire may include the first, second, and third metal layers.

According to an embodiment of the present disclosure, a display device comprises a substrate including a display area and a pad area, on one side of the display area, a first conductive layer on the substrate and including a lower metal layer in the display area and a first pad wire in the pad area, a buffer layer on the first conductive layer, a semiconductor layer on the buffer layer and overlapping with the lower metal layer in the display area, a gate insulating layer on the semiconductor layer and the buffer layer, a second conductive layer on the gate insulating layer and including a gate electrode overlapping with the semiconductor layer and in the display area, and a second pad wire overlapping with the first pad wire and in the pad area, a first interlayer insulating layer on the second conductive layer, a third conductive layer on the first interlayer insulating layer and including a capacitor electrode overlapping with the gate electrode and in the display area, a second interlayer insulating layer on the third conductive layer, a fourth conductive layer on the second interlayer insulating layer and including a first connection electrode, connected to the semiconductor layer and the lower metal layer, and in the display area, a passivation layer on the fourth conductive layer, and a plurality of light-emitting elements on the passivation layer and spaced apart from one another, wherein the first conductive layer includes a first metal layer including vanadium (V), a second metal layer on the first metal layer and including aluminum (Al) or an Al alloy, and a third metal layer, on the second metal layer and including V or titanium (Ti).

A thickness of the second metal layer may be greater than a thickness of the first metal layer and a thickness of the third metal layer, and the thickness of the first metal layer may be greater than the thickness of the third metal layer.

The thickness of the first metal layer may be from 1000 Å to half the thickness of the second metal layer, and the thickness of the third metal layer may be 1/10 of the thickness of the second metal layer.

At least one of the second conductive layer or the third conductive layer may include the first, second, and third metal layers.

The fourth conductive layer may include a base layer including Ti, a middle layer on the base layer and including Al or an Al alloy, and an upper layer on the middle layer and including Ti.

According to the aforementioned and other embodiments of the present disclosure, at least one or more of a plurality of conductive layers have a structure in which multiple metal layers are stacked, and the multiple metal layers include a main metal layer and a base metal layer, which can form an electrical detour path in case of the loss of the main metal layer. As the base metal layer includes vanadium (V), which has a low or suitable resistance and is less likely to diffuse into the main metal layer, the occurrence of wiring defects in the conductive layers can be minimized or reduced even when exposed to a high-temperature environment from a laser curing process.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in more detail embodiments thereof with reference to the attached drawings, in which.

DETAILED DESCRIPTION

The subject matter of the present disclosure will now be described more fully hereinafter with reference to the accompanying drawings, in which embodiments of the present disclosure are shown. The subject matter of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
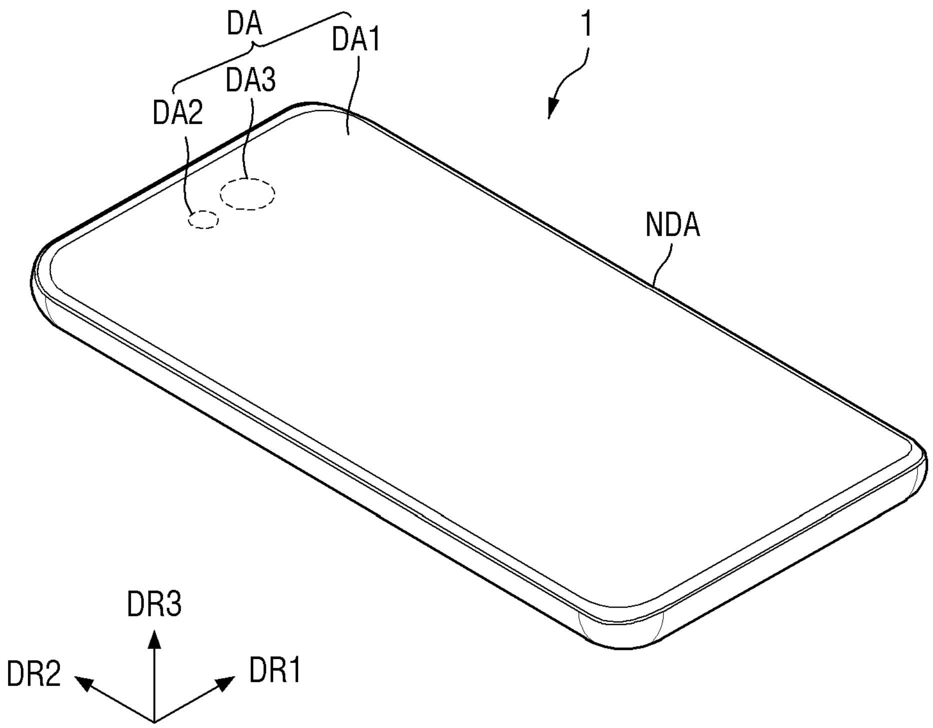
FIG. 1 is a perspective view of an electronic device according to an embodiment of the present disclosure.

FIG. 1 is a perspective view of an electronic device according to an embodiment of the present disclosure.

Referring to FIG. 1, an electronic device 1 displays (e.g., is capable of displaying) a moving image and/or a still image. The electronic device 1 may refer to any suitable (e.g., nearly all types or kinds of) electronic devices capable of providing a display screen. Examples of the electronic device 1 may include a television (TV), a notebook computer, a monitor, an electronic billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book reader, a portable multimedia player (PMP), a navigation device, a gaming console, a digital camera, and a camcorder.

Figure 2:
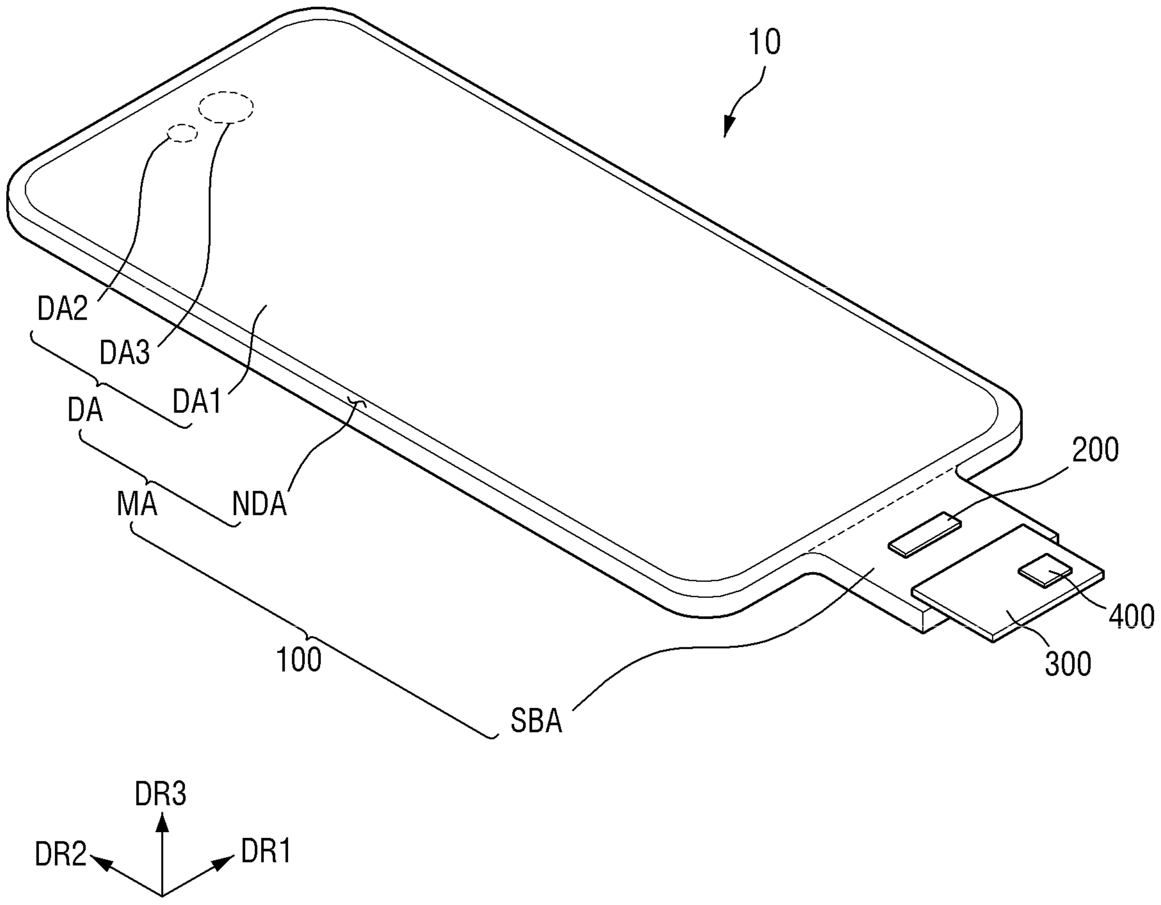
FIG. 2 is a perspective view of a display device included in the electronic device according to an embodiment of the present disclosure.

The electronic device 1 may include a display device 10 of FIG. 2. Examples of the display device 10 may include an inorganic light-emitting diode display device, an organic light-emitting diode (OLED) display device, a quantum-dot light-emitting display device, a plasma display device, and a field emission display (FED) device. The display device 10 will hereinafter be described as being, for example, an OLED display device, but the present disclosure is not limited thereto. The display device 10 may also include (e.g., be applicable to) various other display devices.

The shape of the electronic device 1 may vary. For example, the electronic device 1 may have a rectangular shape that extends longer horizontally than vertically, a rectangular shape that extends longer vertically than horizontally, a square shape, a rectangular shape with rounded corners, another polygonal shape, or a circular shape. A display area DA of the electronic device 1 may generally have a similar shape to the electronic device 1. FIG. 1 illustrates that the electronic device 1 has a rectangular shape that extends longer in a second direction DR2 than in a first direction DR1.

The electronic device 1 may include a display area DA and a non-display area NDA. The display area DA may be an area where an image can be displayed, and the non-display area NDA may be an area where an image is not displayed. The display area DA may also be referred to as an active area, and the non-display area NDA may also be referred to as an inactive area. The display area DA may generally account for the middle of the electronic device 1.

The display area DA may include first, second, and third display areas DA1, DA2, and DA3. The second and third display areas DA2 and DA3 may be component areas where components for adding various suitable functions are disposed.

FIG. 2 is a perspective view of a display device included in the electronic device of FIG. 1.

Referring to FIG. 2, the electronic device 1 of FIG. 1 may include the display device 10. The display device 10 may provide a display screen for the electronic device 1. The display device 10 may have a similar shape to the electronic device 1. For example, the display device 10 may have an approximately rectangular shape having short sides extending in the first direction DR1 and long sides extending in the second direction DR1. The corners where the short sides and the long sides of the display device 10 meet may be rounded to have a set or predetermined curvature or may be right-angled. The shape of the display device 10 is not particularly limited, and the display device 10 may be formed in various other suitable shapes such as another polygonal shape, a circular shape, or an elliptical shape.

The display device 10 may include a display panel 100, a display driving unit 200, a circuit board 300, and a touch driving unit 400.

The display panel 100 may include a main area MA and a subarea SBA.

The main area MA may include a display area DA, which includes pixels for displaying an image, and a non-display area NDA, which is disposed around the display area DA. The display area DA may include the first, second, and third display areas DA1, DA2, and DA3. The display area DA may emit light through a plurality of emission areas or openings. For example, the display panel 100 may include pixel circuits including switching elements, a pixel-defining film defining the emission areas or the openings, and self-light-emitting elements.

For example, the self-light-emitting elements may include organic light-emitting diodes (OLEDs), quantum-dot light-emitting diodes (LEDs) including a quantum-dot light-emitting layer, inorganic LEDs including an inorganic semiconductor, and/or micro LEDs, but the present disclosure is not limited thereto.

The non-display area NDA may be on the outside of the display area DA. The non-display area NDA may be defined as an edge part of the main area MA. The non-display area NDA may include a gate driving unit providing gate signals to gate lines and fan-out lines connecting the display driving unit 200 and the display area DA.

The subarea SBA may be an area extending from one side of the main area MA. The subarea SBA may include a flexible material that is bendable, foldable, and/or rollable. For example, in a case where the subarea SBA is bendable, the subarea SBA may be bent to overlap with the main area MA in a thickness direction (or a third direction DR3). The subarea SBA may include the display driving unit 200 and a pad unit, which is connected to the circuit board 300. In some embodiments, the subarea SBA may not be provided, and the display driving unit 200 and the pad unit may be disposed in the non-display area NDA.

The display driving unit 200 may output signals and voltages for driving the display panel 100. The display driving unit 200 may provide data voltages to data lines. The display driving unit 200 may provide power supply voltages to power supply lines and may provide gate control signals to the gate driving unit. The display driving unit 200 may be formed as an integrated circuit (IC) and may be mounted on the display panel 100 in a chip-on-glass (COG) or chip-on-plastic (COP) manner or via ultrasonic bonding. In some embodiments, the display driving unit 200 may be disposed in the subarea SBA and may overlap with the main area MA in the thickness direction when the subarea SBA is bent. In some embodiments, the display driving unit 200 may be mounted on the circuit board 300.

The circuit board 300 may be attached to the pad unit of the display panel 100 via an anisotropic conductive film (ACF). Lead lines of the circuit board 300 may be electrically connected to the pad unit of the display panel 100. The circuit board 300 may be a printed circuit board (PCB), a flexible PCB (FPCB), or a flexible film such as a chip-on-film (COF).

The touch driving unit 400 may be mounted on the circuit board 300. The touch driving unit 400 may be electrically connected to a touch sensing unit of the display panel 100. The touch driving unit 400 may provide a touch driving signal to a plurality of touch electrodes of the touch sensing unit and may sense capacitance variations between the touch electrodes. For example, the touch driving signal may be a pulse signal having a set or predetermined frequency. The touch driving unit 400 may calculate the presence and coordinates of input based on the capacitance variations between the touch electrodes. The touch driving unit 400 may be formed as an integrated circuit (IC).

Figure 3:
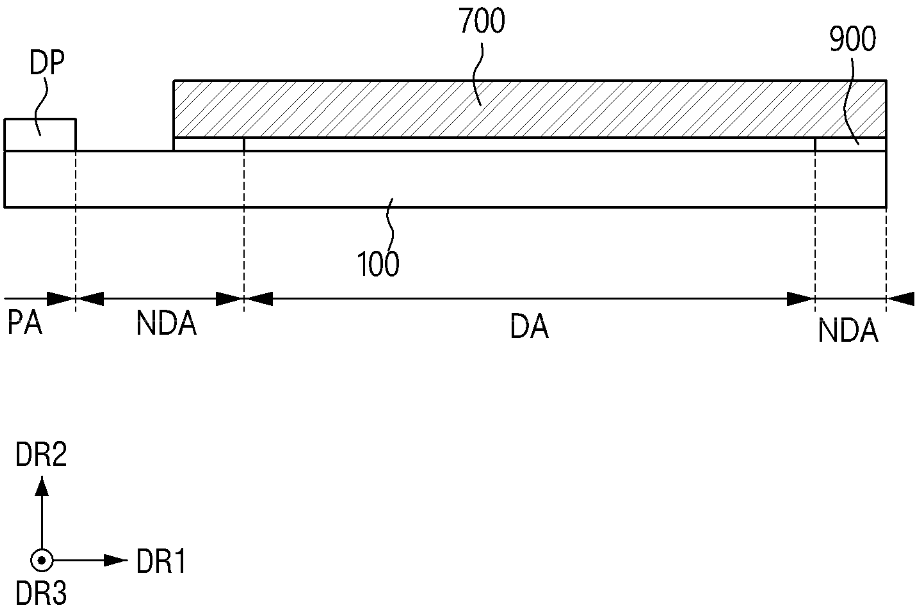
FIG. 3 is a side view of the display device of FIG. 2.
Figure 4:
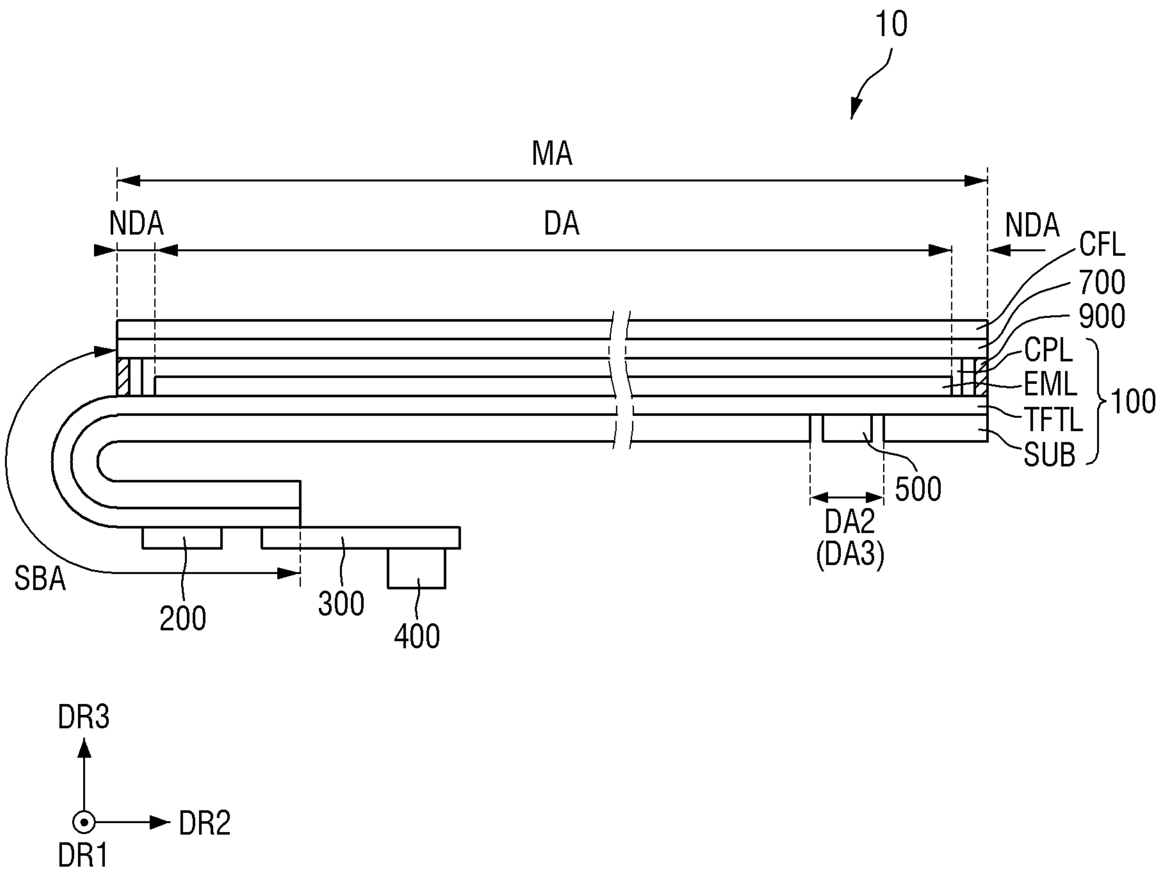
FIG. 4 is a cross-sectional view of the display device of FIG. 2.

FIG. 3 is a side view of the display device of FIG. 2. FIG. 4 is a cross-sectional view of the display device of FIG. 2.

Referring to FIGS. 3 and 4, the display device may include the display panel 100, an encapsulation substrate 700, and a sealing member 900, which is disposed between the display panel 100 and the encapsulation substrate 700. A touch layer TSU (see FIG. 6) may be disposed on the encapsulation substrate 700, and the display driving unit 200, the circuit board 300, and the touch driving unit 400 may be disposed in the subarea SBA of the display panel 100.

The display panel 100 may include a substrate SUB, a thin-film transistor (TFT) layer TFTL, a light-emitting element layer EML, and a thin-film encapsulation layer CPL.

The substrate SUB may be a base substrate or a base member. The substrate SUB may be a flexible substrate that is bendable, foldable, and/or rollable. For example, the substrate SUB may include a polymer resin such as polyimide (PI), but the present disclosure is not limited thereto. In another example, the substrate SUB may include a glass material and/or a metal material.

The TFT layer TFTL may be disposed on the substrate SUB. The TFT layer TFTL may include a plurality of TFTs that form the pixel circuitry of pixels. The TFT layer TFTL may further include gate lines, data lines, power lines, gate control lines, and fan-out lines connecting the display driving unit 200 and the data lines, and lead lines connecting the display driving unit 200 and the pad unit. The TFTs may include semiconductor regions, source electrodes, drain electrodes, and gate electrodes. For example, in a case where the gate driving unit is formed on one side of the non-display area NDA of the display panel 100, the gate driving unit may include TFTs.

The TFT layer TFTL may be disposed in the display area DA, the non-display area NDA, and the subarea SBA. The TFTs, the gate lines, the data lines, and the power lines of the TFT layer TFTL may be disposed in the display area DA. The gate control lines and the fan-out lines of the TFT layer TFTL may be disposed in the non-display area NDA. The lead lines of the TFT layer TFTL may be disposed in the subarea SBA.

The light-emitting element layer EML may be disposed on the TFT layer TFTL. The light-emitting element layer EML may include a plurality of light-emitting elements ED, which include first electrodes, second electrodes, light-emitting layers and may emit light, and a pixel-defining film, which defines the pixels. The light-emitting elements ED of the light-emitting element layer EML may be disposed in the display area DA.

The light-emitting layers may be organic light-emitting layers including an organic material. The light-emitting layers may include hole transport layers, organic light-emitting layers, and electron transport layers. As the first electrodes receive a voltage through the TFTs of the TFT layer TFTL and the second electrodes receive a cathode voltage, holes and electrons may move to the organic emission layers through the hole transport layers and the electron transport layers, respectively, and may combine together in the organic light-emitting layers to emit light.

In some embodiments, the light-emitting elements ED may be quantum-dot light-emitting diodes (LEDs) including quantum-dot light-emitting layers, inorganic LEDs including an inorganic semiconductor, or micro-LEDs.

A capping layer CPL may cover the top surface and sides of the light-emitting element layer EML and may protect the light-emitting element layer EML. The capping layer CPL may include at least one inorganic film and at least one organic film for encapsulating the light-emitting element layer EML.

The encapsulation substrate 700 (or a second substrate) is disposed on the display panel 100. For example, the encapsulation substrate 700 may be disposed to face the display panel 100 in a thickness direction or a Z-axis (e.g., DR3) direction. In a plan view, the encapsulation substrate 700 may have a smaller area than the display panel 100, but may be disposed to cover the display area DA of the display panel 100. The encapsulation substrate 700 may seal the light-emitting elements ED and circuit elements disposed in the display panel 100, together with the sealing member 900. In some embodiments, the touch layer TSU, a polarizer layer, and/or the like may be further disposed on the encapsulation substrate 700.

The encapsulation substrate 700 may be a transparent plate or film. For example, the encapsulation substrate 700 may include a glass material and/or a quartz material. In some embodiments, the encapsulation substrate 700 may be spaced apart from the light-emitting elements ED, and the space between the encapsulation substrate 700 and the light-emitting elements ED may be filled with an inert gas such as a nitrogen gas. However, the present disclosure is not limited to this. The space between the encapsulation substrate 700 and the light-emitting elements ED may be filled with a filler or may be a vacuum.

The sealing member 900 may be disposed between the display panel 100 and the encapsulation substrate 700. For example, the sealing member 900 may be disposed in the non-display area NDA of the display panel 100 to surround the display area DA of the display panel 100, and may seal the light-emitting elements ED and the circuit elements of the display panel 100, together with the encapsulation substrate 700. The sealing member 900 may couple the display panel 100 and the encapsulation substrate 700 together.

In some embodiments, the sealing member 900 may be cured frit. Here, the term "frit" may refer to a structure having glass properties, formed by melting and curing powdery glass with additives optionally added thereto. The powdery glass may be disposed between the display panel 100 and the encapsulation substrate 700 and may undergo firing and melting processes to form frit capable of coupling the display panel 100 and the encapsulation substrate 700 together.

As the sealing member 900 is formed by firing and melting processes during the fabrication of the display device 10, the display panel 100 and the encapsulation substrate 700 may be coupled together by being physically bonded to the sealing member 900. The sealing member 900 may be fused to at least the encapsulation substrate 700 and may include parts where there are physical boundaries with the display panel 100 and the encapsulation substrate 700 and parts that are fused to the display panel 100 and the encapsulation substrate 700 so that there are no physical boundaries with the display panel 100 and the encapsulation substrate 700. As the sealing member 900 includes fused parts, the sealing member 900 can be firmly coupled to the display panel 100 and the encapsulation substrate 700. The sealing member 900 may have a strong adhesive force at the boundary with the encapsulation substrate 700, and thus, the durability of the display device 10 against external impact or shock can be improved.

The touch layer TSU may be disposed on the encapsulation substrate 700. The touch layer TSU may include a plurality of touch electrodes for detecting touch input from a user in a capacitive manner and touch lines for connecting the touch electrodes and the touch driving unit 400. For example, the touch layer TSU may sense touch input from the user in a mutual capacitance manner or in a self-capacitance manner.

In some embodiments, the touch layer TSU may be disposed on the capping layer CPL. In this case, the encapsulation substrate 700 may not be provided.

The touch electrodes of the touch layer TSU may be disposed in a touch sensor area, which overlaps with the display area DA. The touch lines of the touch layer TSU may be disposed in a touch peripheral area, which overlaps with the non-display area NDA.

In some embodiments, the color filter layer CFL may be disposed on the touch layer TSU. The color filter layer may include a plurality of color filters, which correspond to a plurality of emission areas. Each of the color filters may selectively transmit light of a particular wavelength therethrough and may block and/or absorb light of other wavelengths. The color filter layer CFL may absorb some of the external light entered into the display device 10 and may thus reduce reflection of external light. Accordingly, the color filter layer CFL can prevent or reduce any color distortions that may be caused by the reflection of external light.

In some embodiments, the display device 10 may further include an optical device 500. The optical device 500 may be disposed in the second or third display area DA2 or DA3. The optical device 500 may emit and/or receive infrared light, ultraviolet light, and/or visible light. For example, the optical device 500 may be an optical sensor capable of sensing light incident upon the display device 10, such as a proximity sensor, a light sensor, a camera sensor, and/or an image sensor.

Figure 5:
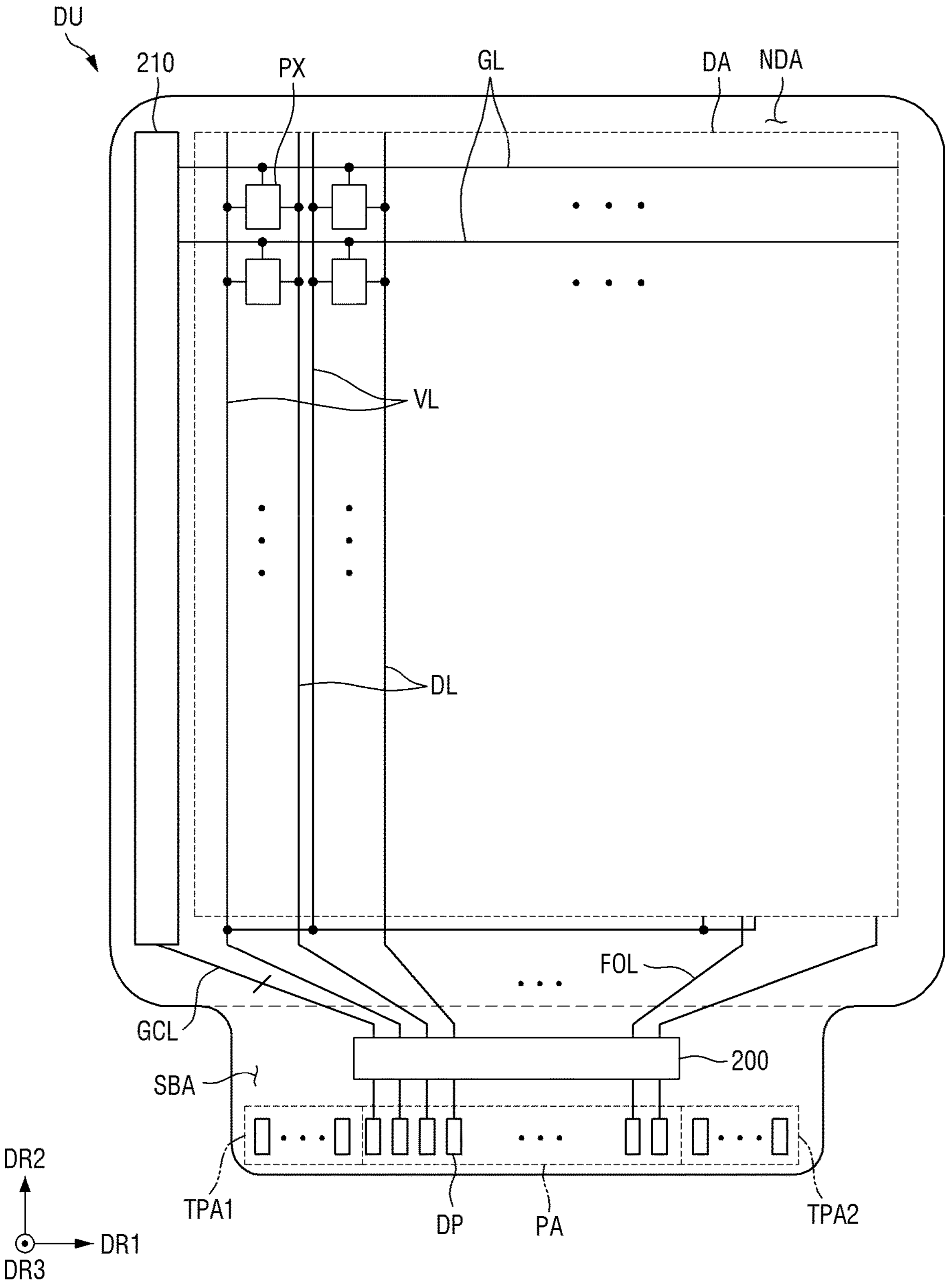
FIG. 5 is a plan view of a display panel of the display device of FIG. 2.

FIG. 5 is a plan view of a display panel of the display device of FIG. 2.

Referring to FIG. 5, the display panel 100 (or DU) may include the display area DA and the non-display area NDA.

The display area DA may be disposed in the middle of the display panel 100. A plurality of pixels PX, a plurality of gate lines GL, a plurality of data lines DL, and a plurality of power supply lines VL may be disposed in the display area DA. The pixels PX may be defined as minimal (e.g., the smallest) units for emitting light.

The gate lines GL may provide gate signals received from the gate driving unit 210 to the pixels PX. The gate lines GL may extend in the first direction DR1 and may be spaced apart from one another in the second direction DR2, which intersects the first direction DR1.

The data lines DL may provide data voltages received from the display driving unit 200 to the pixels PX. The data lines DL may extend in the second direction DR2 and may be spaced apart from one another in the first direction DR1.

The power supply lines VL may provide the power supply voltages received from the display driving unit 200 to the pixels PX. Here, the power supply voltages include a driving voltage, an initialization voltage, a reference voltage, and/or a low-potential voltage. The power supply lines VL may extend in the second direction DR2 and may be spaced apart from one another in the first direction DR1.

The non-display area NDA may surround the display area DA. The gate driving unit 210, fan-out lines FOL, and gate control lines GCL may be disposed in the non-display area NDA. The gate driving unit 210 may generate a plurality of gate signals based on the gate control signals and may sequentially provide the gate signals to the gate lines GL in a predefined order.

The fan-out lines FOL may extend from the display driving unit 200 to the display area DA. The fan-out lines FOL may provide data voltages received from the display driving unit 200 to the data lines DL.

The gate control lines GCL may extend from the display driving unit 200 to the gate driving unit 210. The gate control lines GCL may provide gate control signals received from the display driving unit 200 to the gate driving unit 210.

The subarea SBA may include the display driving unit 200, a pad area PA, and first and second touch areas TPA1 and TPA2.

The display driving unit 200 may output signals and voltages for driving the display panel 100 to the fan-out lines FOL. The display driving unit 200 may provide data voltages to the data lines DL through the fan-out lines FOL. The data voltages may be provided to the pixels PX and may control the luminance of the pixels PX. The display driving unit 200 may provide gate control signals to the gate driving unit 210 through the gate control lines GCL.

The pad area PA, the first touch pad area TPA1, and the second touch pad area TPA2 may be disposed on an edge of the subarea SBA. The pad area PA, the first touch pad area TPA1, and the second touch pad area TPA2 may be electrically connected to the circuit board 300 via an anisotropic conductive film (ACF) or a self-assembly anisotropic conductive paste (SAP).

The pad area PA may include a plurality of display pads DP. The display pads DP may be connected to a graphics system via the circuit board 300. The display pads DP may be connected to the circuit board 300 and may thus receive digital video data and provide the digital video data to the display driving unit 200.

Figure 6:
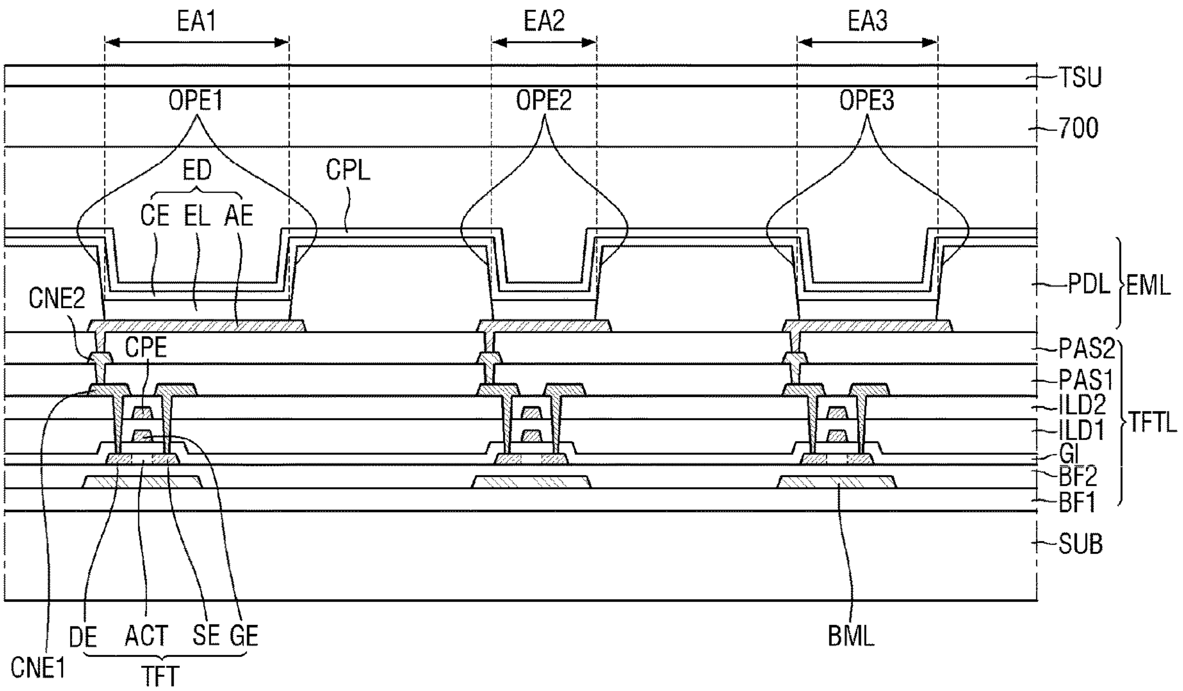
FIG. 6 is a cross-sectional view illustrating a display area of the display device of FIG. 2.

FIG. 6 is a cross-sectional view illustrating a display area of the display device of FIG. 2. FIG. 6 illustrates parts of the display device 10, particularly, the substrate SUB, the TFT layer TFTL, the light-emitting element layer EML, and the capping layer CPL of the display panel 100, the encapsulation substrate 700, and the touch layer TSU.

Referring to FIG. 6, the substrate SUB may be a base substrate or a base member. The substrate SUB may be a flexible substrate that is bendable, foldable, and/or rollable. For example, the substrate SUB may include a polymer resin such as PI, but the present disclosure is not limited thereto. In another example, the substrate SUB may include a glass and/or metal material.

The TFT layer TFTL may include a first buffer layer BF1, a lower metal layer BML, a second buffer layer BF2, TFTs “TFT”, a gate insulating layer GI, a first interlayer insulating layer ILD1, capacitor electrodes CPE, a second interlayer insulating layer ILD2, first connection electrodes CNE1, a first passivation layer PAS1, second connection electrodes CNE2, and a second passivation layer PAS2.

The first buffer layer BF1 may be disposed on the substrate SUB. The first buffer layer BF1 may include an inorganic film capable of preventing or reducing the infiltration of the air and/or moisture. For example, the first buffer layer BF1 may include a plurality of inorganic films that are stacked.

The lower metal layer BML, which corresponds to a first conductive layer of the display panel 100, may be disposed on the first buffer layer BF1. For example, the lower metal layer BML may be formed as a single layer or a multilayer including vanadium (V), molybdenum (Mo), aluminum (Al), chromium (Cr), gold (Au), titanium (Ti), nickel (Ni), neodymium (Nd), copper (Cu), and/or an alloy thereof, but the present disclosure is not limited thereto.

The second buffer layer BF2 may cover the first buffer layer BF1 and the lower metal layer BML. The second buffer layer BF2 may include an inorganic film capable of preventing or reducing the infiltration of the air and/or moisture. For example, the second buffer layer BF2 may include a plurality of inorganic films that are stacked.

The TFTs “TFT” may be disposed on the second buffer layer BF2 and may form the pixel circuitry of a plurality of pixels. For example, the TFTs “TFT” may be driving transistors or switching transistors. The TFTs “TFT” may include semiconductor layers ACT, source electrodes SE, drain electrodes DE, and gate electrodes GE.

The semiconductor layers ACT may be disposed on the second buffer layer BF2. The semiconductor layers ACT may overlap with the lower metal layer BML and the gate electrodes GE in the thickness direction and may be insulated from the gate electrodes GE by the gate insulating layer GI. Parts of the semiconductor layers ACT may be transformed into conductors and may thus form the source electrodes SE and the drain electrodes DE.

The gate electrodes GE, which correspond to a second conductive layer of the display panel 100, may be disposed on the gate insulating layer GI. The gate electrodes GE may overlap with the semiconductor layers ACT with the gate insulating layer GI interposed therebetween.

The gate insulating layer GI may be disposed on the semiconductor layers ACT. For example, the gate electrodes GE may cover the semiconductor layers ACT and the second buffer layer BF2, and the gate insulating layer GI may insulate the semiconductor layers ACT and the gate electrodes GE. The gate insulating layer GI may include contact holes that are penetrated by the first connection electrodes CNE1.

A first interlayer insulating layer ILD1 may cover the gate electrodes GE and the gate insulating layer GI. The first interlayer insulating layer ILD1 may include contact holes that are penetrated by the first connection electrodes CNE1. The contact holes of the first interlayer insulating layer ILD1 may be connected to the contact holes of the gate insulating layer GI and contact holes of a second interlayer insulating layer ILD2.

The capacitor electrodes CPE, which correspond to a third conductive layer of the display panel 100, may be disposed on the first interlayer insulating layer ILD1. The capacitor electrodes CPE may overlap with the gate electrodes GE in the thickness direction. The capacitor electrodes CPE and the gate electrodes GE may form capacitors.

The second interlayer insulating layer ILD2 may cover the capacitor electrodes CPE and the first interlayer insulating layer ILD1. The second interlayer insulating layer ILD2 may include contact holes that are penetrated by the first connection electrodes CNE1. The contact holes of the second interlayer insulating layer ILD2 may be connected to the contact holes of the first interlayer insulating layer ILD1 and the contact holes of the gate insulating layer GI.

The first connection electrodes CNE1, which correspond to a fourth conductive layer of the display panel 100, may be disposed on the second interlayer insulating layer ILD2. The first connection electrodes CNE1 may electrically connect the drain electrodes DE of the TFTs “TFT” and the second connection electrodes CNE2. The first connection electrodes CNE1 may be inserted in the contact holes of each of the second interlayer insulating layer ILD2, the first interlayer insulating layer ILD1, and the gate insulating layer GI and may thus be in contact with the drain electrodes DE of the TFTs “TFT”.

The first passivation layer PAS1 may cover the first connection electrodes CNE1 and the second interlayer insulating layer ILD2. The first passivation layer PAS1 may protect the TFTs “TFT”. The first passivation layer PAS1 may include contact holes that are penetrated by the second connection electrodes CNE2.

The second connection electrodes CNE2, which correspond to a fifth conductive layer of the display panel 100, may be disposed on the first passivation layer PAS1. The second connection electrodes CNE2 may electrically connect the first connection electrodes CNE1 and pixel electrodes AE of light-emitting elements ED. The second connection electrodes CNE2 may be inserted in the contact holes of the first passivation layer PAS1 and may be in contact with the first connection electrodes CNE1.

The second passivation layer PAS2, which correspond to a fifth conductive layer of the display panel 100, may cover the second connection electrodes CNE2 and the first passivation layer PAS1. The second passivation layer PAS2 may include contact holes that are penetrated by the pixel electrodes AE of the light-emitting elements ED.

The light-emitting element layer EML may be disposed on the TFT layer TFTL. The light-emitting element layer EML may include the light-emitting elements ED and a pixel-defining film PDL. The light-emitting elements ED may include the pixel electrodes AE, light-emitting layers EL, and a common electrode CE.

The pixel electrodes AE may be disposed on the second passivation layer PAS2. The pixel electrodes AE may be disposed to overlap with openings (OPE1, OPE2, and OPE3) of the pixel-defining film PDL. The pixel electrodes AE may be electrically connected to the drain electrodes DE of the TFTs “TFT” through the first connection electrodes CNE1 and the second connection electrodes CNE2.

The light-emitting layers EL may be disposed on the pixel electrodes AE. For example, the light-emitting layers EL may be organic light-emitting layers formed of an organic material, but the present disclosure is not limited thereto. In a case where the light-emitting layers EL are organic light-emitting layers, the TFTs “TFT” may apply a set or predetermined voltage to the pixel electrodes AE of the light-emitting elements ED, and in response to the common electrode CE of the light-emitting elements ED receiving a common voltage or a cathode voltage, holes and electrons may move to the light-emitting layers EL through hole transport layers and electron transport layers, respectively, and may combine together in the light-emitting layers EL to emit light.

The common electrode CE may be disposed on the light-emitting layers EL. For example, the common electrode CE may be implemented in common for all pixels, rather than being separate for different pixels. The common electrode CE may be disposed on the light-emitting layers EL, in the first, second, and third emission areas EA1, EA2, and EA3, and may be disposed on the pixel-defining film PDL, in areas other than the first, second, and third emission areas EA1, EA2, and EA3.

The common electrode CE may receive a common voltage or a low-potential voltage. When the pixel electrodes AE receive a voltage corresponding to a data voltage and the common voltage CE receives a low-potential voltage, an electrical potential difference may be generated between the pixel electrodes AE and the common electrode CE, and as a result, the light-emitting layers EL may emit light.

The pixel-defining film PDL may include a plurality of openings (OPE1, OPE2, and OPE3) and may be disposed on parts of the second passivation layer PAS2 and the pixel electrodes AE. The pixel-defining film PDL may include first, second, and third openings OPE1, OPE2, and OPE3, and the first, second, and third openings OPE1, OPE2, and OPE3 may expose parts of the pixel electrodes AE. As already mentioned above, the first, second, and third openings OPE1, OPE2, and OPE3 of the pixel-defining film PDL may define the first, second, and third emission areas EA1, EA2, and EA3, respectively, and may have different areas or sizes. The pixel-defining film PDL may separate and insulate the pixel electrodes AE of the light-emitting elements ED from one another. The pixel-defining film PDL may include a light-absorbing material and may thus be able to prevent or reduce the reflection of light. For example, the pixel-defining film PDL may include a polyimide (PI)-based binder and the mixture of red, green, and blue pigments. In another example, the pixel-defining layer PDL may include a cardo-based binder resin and the mixture of a lactam-based black pigment and a blue pigment. In another example, the pixel-defining layer PDL may include carbon black.

The capping layer CPL may be disposed on the common electrode CE. The capping layer CPL may include at least one inorganic film and may prevent or reduce the penetration of oxygen and/or moisture into the light-emitting element layer EML. The capping layer CPL may include aluminum oxide, titanium oxide, tantalum oxide, hafnium oxide, zinc oxide, silicon oxide, silicon nitride, and/or silicon oxynitride.

The encapsulation substrate 700 and the touch layer TSU may be disposed on the capping layer CPL. The encapsulation substrate 700 may be spaced apart from the capping layer CPL and may be bonded to the display panel 100 via the sealing member 900, along the edges of the display panel 100. In some embodiments, the space between the capping layer CPL and the encapsulation substrate 700 may be in a vacuum.

Figure 7:
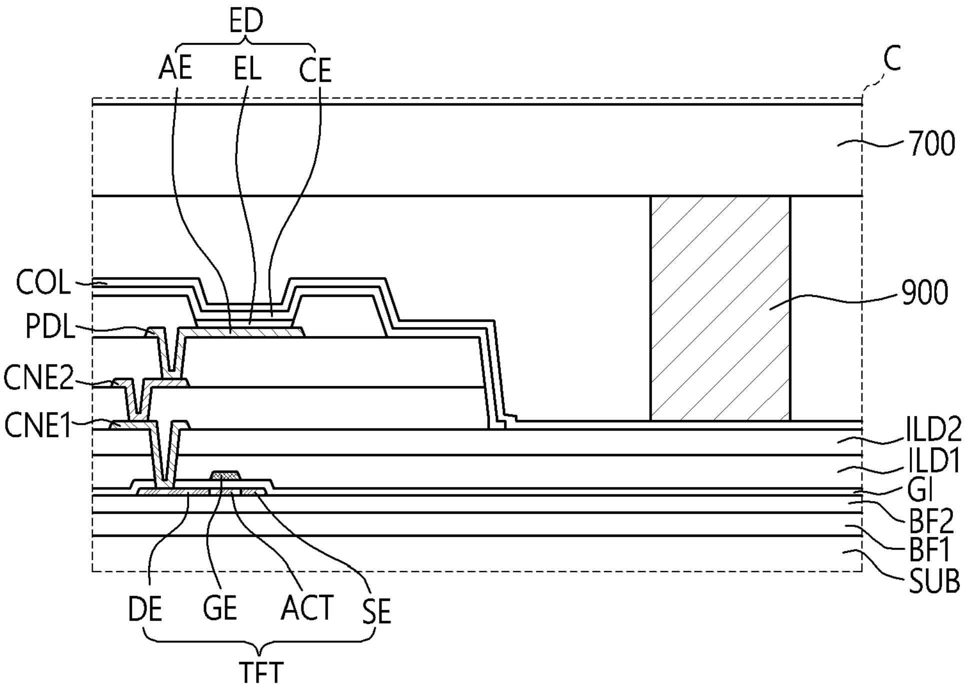
FIG. 7 is a cross-sectional view illustrating an edge of the display device of FIG. 2.

FIG. 7 is a cross-sectional view illustrating an edge of the display device of FIG. 2. FIG. 7 illustrates the non-display area NDA of the display device 10.

Referring to FIG. 7, the sealing member 900 of the display device 10 may be disposed in the non-display area NDA of the display panel 100 to form a closed loop in a plan view and to surround the display area DA of the display panel 100. The sealing member 900 may be disposed on the second interlayer insulating layer ILD2, in the non-display area NDA. The sealing member 900 may not overlap with the conductive layers in the display panel 100, but the present disclosure is not limited thereto. In some embodiments, the sealing member 900 may overlap with, but may not be in direct contact with, the conductive layers below the second interlayer insulating layer ILD2, in the non-display area NDA. In some embodiments, the sealing member 900 may be disposed directly on the substrate SUB of the display panel 100. The sealing member 900 may surround the light-emitting elements ED, which are disposed in the display area DA, and may seal the space between the encapsulation substrate 700 and the display panel 100. The sealing member 900 and the encapsulation substrate 700 may prevent or substantially prevent the light-emitting elements ED from being damaged by the air and/or moisture.

The display panel 100 and the encapsulation substrate 700 of the display device 10 may be bonded together via the sealing member 900. The sealing member 900 may include frit and may physically bond the display panel 100 and the encapsulation substrate 700 together. To improve the adhesion of the sealing member 900, the display panel 100, the encapsulation substrate 700, and the sealing member 900 may be fused together by applying laser light to the sealing member 900 during the fabrication of the display device 10. As a result, the materials of the display panel 100 and the sealing member 900 and the materials of the sealing member 900 and the encapsulation substrate 700 may be mixed together so that the adhesion between the display panel 100, the encapsulation substrate 700, and the sealing member 900 may be improved.

During the curing of the sealing member 900, the temperature of the display panel 100 may increase due to the laser light applied to the sealing member 900. As the laser light is applied, the temperature around the sealing member 900 may rise up to 900° C., and as a result, the conductive layers disposed in the display panel 100 may be damaged by such a high temperature. when the temperature of the display panel 100 rises due to the application of the laser light, the metal materials of the conductive layers in the display panel 100 may even melt, and the wirings of the conductive layers may be partially damaged (e.g., lost and/or thinned down).

To address this, the wirings of the display panel 100 may be formed of metal materials with a high or suitable melting point. For example, metal materials including molybdenum (Mo) may be utilized to form the wirings of the display panel 100, and Mo has a higher resistance than aluminum (Al), which has a relatively low or suitable melting point. However, when the display panel 100 includes Al-based metal wires, the driving speed of the display panel 100 can be improved, and the display device 10 can be miniaturized. Accordingly, at least some of the conductive layers in the display panel 100 of the display device 10 may include Al and may have a structure capable of preventing or reducing any wiring defects even when the Al melts during a laser curing process.

Figure 8:
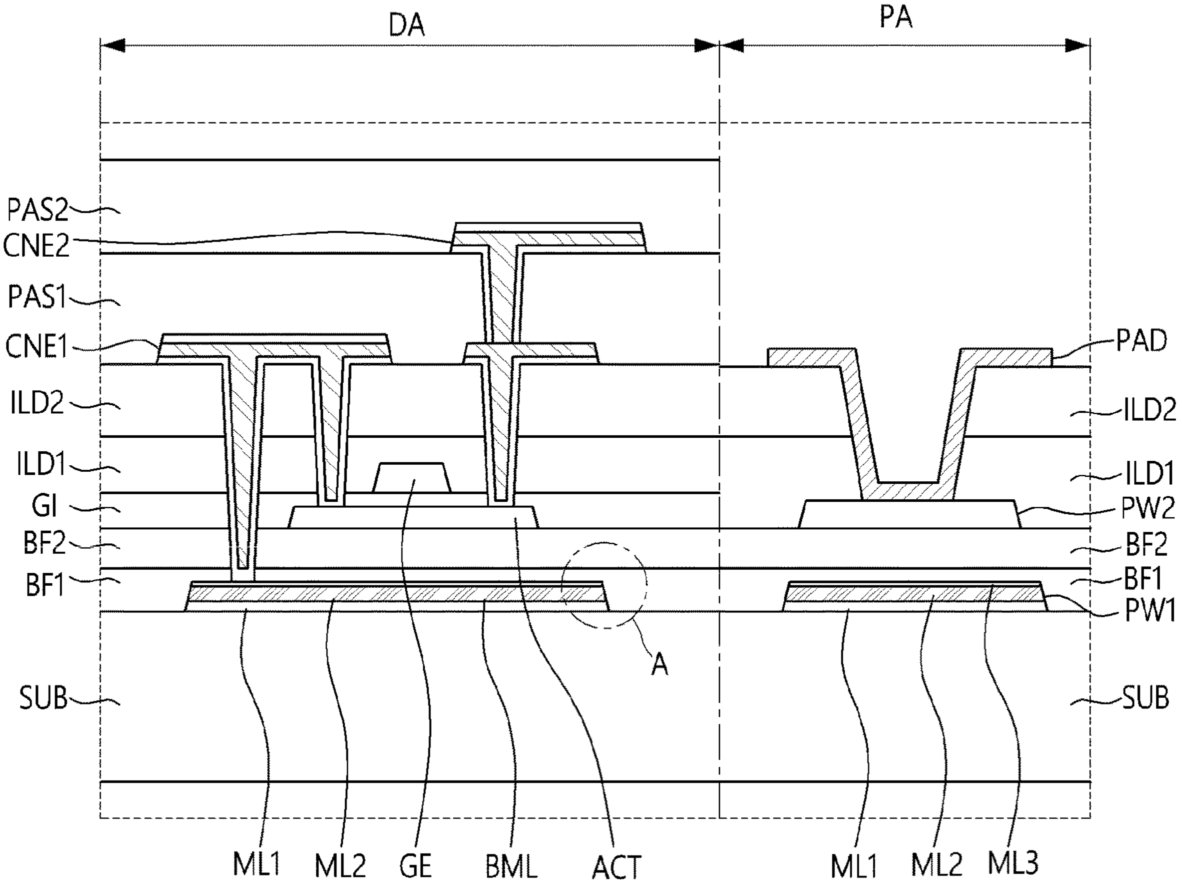
FIG. 8 is a cross-sectional view illustrating a plurality of conductive layers disposed in a display device according to another embodiment of the present disclosure.
Figure 9:
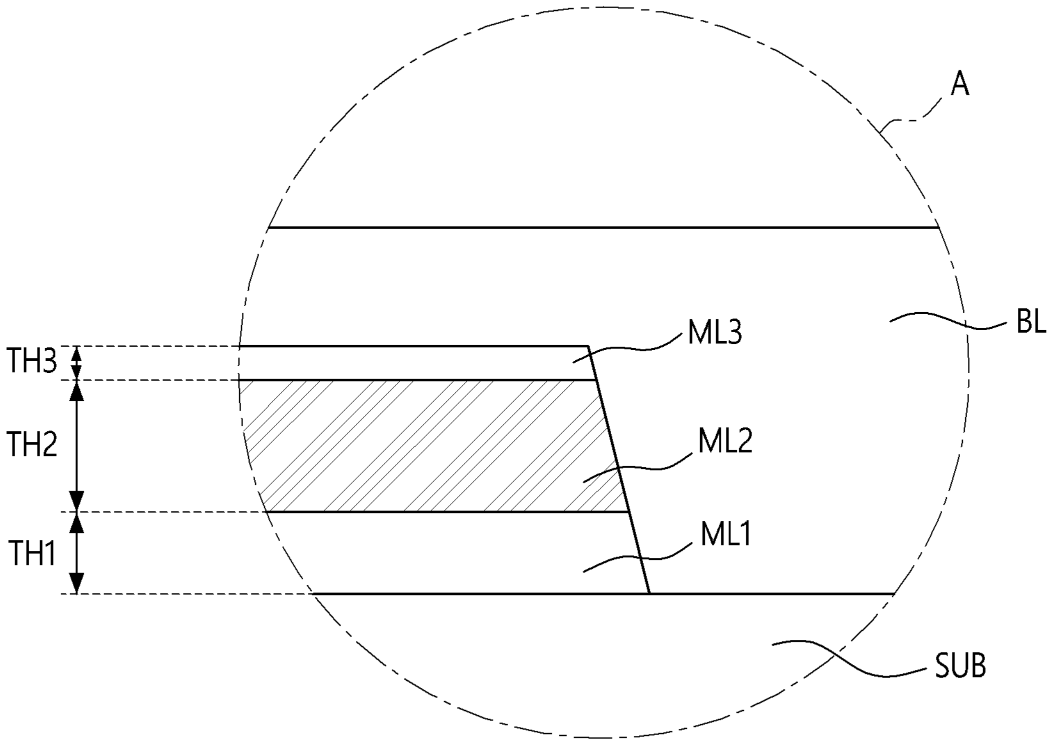
FIG. 9 is an enlarged cross-sectional view of part A of FIG. 8.

FIG. 8 is a cross-sectional view illustrating a plurality of conductive layers disposed in a display device according to another embodiment of the present disclosure. FIG. 9 is an enlarged cross-sectional view of part A of FIG. 8. FIG. 8 illustrates a TFT "TFT" and a display pad DP in the display area DA of the display panel 100. FIG. 9 illustrates part of the first conductive layer of FIG. 8, particularly, the lower metal layer BML.

Referring to FIGS. 8 and 9, the display device 10 may include the display pad DP, which is disposed in the pad area PA, and a pad electrode PAD, which is connected to the display pad DP. The display pad DP may include a plurality of pad wires (PW1 and PW2). The pad wires (PW1 and PW2) may be disposed in the same layer as the first or second conductive layer in the display area DA.

For example, the pad wires (PW1 and PW2) may include first and second pad wires PW1 and PW2. The first pad wire PW1 may be disposed directly on the first buffer layer BF1, and the second pad wire PW2 may be disposed directly on the second buffer layer BF2. The first pad wire PW1 may be formed of the first conductive layer, in the pad area PA, and the second pad wire PW2 may be formed of the second conductive layer, in the pad area PA.

The first pad wire PW1 and the lower metal layer BML in the display area DA may be formed at the same time and may thus include the same material. The second pad wire PW2 and a gate electrode GE of the TFT "TFT" in the display area DA may be formed at the same time and may thus include the same material. The first and second pad wires PW1 and PW2 are illustrated as overlapping with each other in the thickness direction, but the present disclosure is not limited thereto. In some embodiments, the first and second pad wires PW1 and PW2 may be electrically connected to wirings of the conductive layers in the display area DA, and at least one of the first pad wire PW1 or the second pad wire PW2 may be electrically connected to the pad electrode PAD, which is disposed above the first and second pad wires PW1 and PW2. Also, in some embodiments, the display pad DP may not include the first pad wire PW1 and may include the second pad wire PW2 and a pad wire from another conductive layer disposed thereabove.

The pad electrode PAD may be disposed in the pad area PA and may be connected to the display pad DP. For example, the pad electrode PAD may be in direct contact with the second pad wire PW2 of the display pad DP, but the present disclosure is not limited thereto. In another example, the pad electrode PAD may be in contact with the first pad wire PW1 of the display pad DP. In the pad area PA, the first and second passivation layers PAS1 and PAS2 may not be disposed on the second interlayer insulating layer ILD2. The pad electrode PAD may be disposed directly on the second interlayer insulating layer ILD2 and may be electrically connected to the display pad DP. The pad electrode PAD may be electrically connected to the circuit board 300, and electrical signals from the circuit board 300 may be transmitted to the wirings in the display area DA through the pad electrode PAD and the display pad DP.

At least one of the wirings (or conductive patterns) of the first through fifth conductive layers of the display device 10 may include a plurality of metal layers (ML1, ML2, and ML3). For example, the lower metal layer BML1 and the first pad wire PW1 of the first conductive layer may have a structure in which a plurality of metal layers (ML1, ML2, and ML3) having different compositions are sequentially stacked. Also, for example, the connection electrodes (CNE1 and CNE2) of the fourth and fifth conductive layers may have a structure in which the metal layers (ML1, ML2, and ML3) having different compositions are sequentially stacked. The gate electrode GE and the second pad wire PW2 of the second conductive layer and a capacitor electrode CPE of the third conductive layer may be formed of a single metal layer, but the present disclosure is not limited thereto. In some embodiments, the gate electrode GE and the second pad wire PW2 of the second conductive layer and the capacitor electrode CPE of the third conductive layer may also have a structure in which the metal layers (ML1, ML2, and ML3) having different compositions are sequentially stacked. The wirings (or conductive patterns) of all the first through fifth conductive layers of the display panel 100 may include the metal layers (ML1, ML2, and ML3), or the wirings (or conductive patterns) of only some of the first through fifth conductive layers of the display panel 100 may include the metal layers (ML1, ML2, and ML3).

The metal layers (ML1, ML2, and ML3) may be disposed directly on the first and second buffer layers BF1 and BF2, the first gate insulating layer GI, and/or the first interlayer insulating layer ILD1. The bottom surfaces of the metal layers (ML1, ML2, and ML3) may be in contact with the top surfaces of the first and second buffer layers BF1 and BF2, the first gate insulating layer GI, and/or the first interlayer insulating layer ILD1.

Each of the conductive layers of the display panel 100 may include a first metal layer ML1, a second metal layer ML2, which is disposed on the first metal layer ML1, and a third metal layer ML3, which is disposed on the second metal layer ML2.

The first metal layer ML1 may be a base layer of each of the wirings (or conductive patterns) of the conductive layers of the display panel 100. The first metal layer ML1 may be disposed directly on the first and second buffer layers BF1 and BF2, the first gate insulating layer G, and/or the first interlayer insulating layer ILD1. The bottom surface of the first metal layer ML1 may be in contact with the top surfaces of the first and second buffer layers BF1 and BF2, the top surface of the first gate insulating layer G, and/or the top surface of the first interlayer insulating layer ILD1.

The second metal layer ML2 may be a middle or main layer of each of the wirings (or conductive patterns) of the conductive layers of the display panel 100. The second metal layer ML2 may be disposed directly on the first metal layer ML1, and the bottom surface of the second metal layer ML2 may be in contact with the top surface of the first metal layer ML1. The second metal layer ML2 may include a metal material with low or suitable specific resistance (e.g., lower than the other metal layers) and excellent or suitable electrical conductivity. For example, the second metal layer ML2 may be formed of Al or an Al alloy. For example, the second metal layer ML2 may include an Al alloy such as aluminum-nickel-lanthanum (AlNiLa). In this example, the total content of nickel (Ni) and La may be 0.1 at % or less based on 100% of the total atomic composition of the Al—Ni—La alloy. The second metal layer ML2 may include a material with high or suitable conductivity (e.g., higher than the other metal layers), and thus, the conductive layers of the display panel 100 may have excellent or suitable electrical conductivity.

The third metal layer ML3 may be an upper layer of each of the wirings (or conductive patterns) of the conductive layers of the display panel 100. The third metal layer ML3 may be disposed directly on the second metal layer ML2, and the bottom surface of the third metal layer ML3 may be in contact with the top surface of the second metal layer ML2.

In the lower metal layer BML and the first pad wire PW1 of the first conductive layer, the first metal layer ML1 may include V, and the third metal layer may include vanadium (V) or titanium (Ti). In the lower metal layer BML and the first pad wire PW1 of the first conductive layer, the first, second, and third metal layers ML1, ML2, and ML3 may have a stack of V and Al, an Al alloy and V, V and Al, or an Al alloy and Ti.

As already mentioned above, the second metal layer ML2, which includes a metal material with high or suitable electrical conductivity, may be a main layer that a current in each of the wiring or (conductive pattern) of the first conductive layer mainly flows through. As the display device 10 includes the sealing member 900 and a laser curing process is performed, the second metal layer ML2, which includes Al with a low or suitable melting point, may partially melt during the laser curing process.

The first conductive layer may include the first metal layer ML1, which forms a detour path for a current so that the wiring (or conductive pattern) of the first conductive layer may not be disconnected even when the second metal layer ML2 melts. The third metal layer ML3, which is an upper layer of each of the wirings (or conductive patterns) of the conductive layers of the display panel 100, may be a capping layer for protecting the second metal layer ML2. The third metal layer ML3, similar to the first metal layer ML1, may include V. In some embodiments, the third metal layer ML3, unlike the first metal layer ML1, may include Ti.

V has a higher melting point than Al and has a lower resistance than Ti and Mo. Also, even when the temperature rises during a laser curing process, V is less likely to diffuse at the interface with Al. Also, V, similar to Ti, can be etched together with Al, utilizing a gas containing fluorine (F) and/or chlorine (CI). Thus, as the first metal layer ML1 of at least one of the conductive layers of the display panel 100 includes V, short circuits or defects in the wirings (or conductive patterns) of the conductive layers of the display panel 100 can be prevented or reduced, even when the second metal layer ML2, which is a main layer, melts. Even though part of the second metal layer ML2 melts and may be lost, the first metal layer ML1 below the second metal layer ML2 may form a detour path for a current. Accordingly, any wiring defects that may be caused by the loss of wirings can be prevented or reduced, even when a laser curing process is performed.

In the conductive layers of the display panel 100, the second metal layer ML2 may be thicker than the first and third metal layers ML1 and ML3, and the first metal layer ML1 may be thicker than the third metal layer ML3. The second metal layer ML2 may have the largest thickness, i.e., a second thickness TH2, and a first thickness TH1 of the first metal layer ML1 may be less than the second thickness TH2 and greater than a third thickness TH3 of the third metal layer ML3. The second metal layer ML2 may be a main layer for the conductive layers of the display panel 100 and may have a lowest electrical conductivity. As the second metal layer ML2 includes a metal material with a high or suitable electrical conductivity and has the largest thickness, i.e., the second thickness TH2, the second metal layer ML2 may have a low or suitable resistance. For example, the second metal layer ML2 may include Al or an Al alloy and may have a thickness of 2000 Å to 5000 Å.

The first metal layer ML1 may include V and may form a detour path. The first metal layer ML1 may be thinner than the second metal layer ML2, but may have a set or predetermined minimum thickness to prevent or reduce local heating in accordance with the flow of a current. Also, the first metal layer ML1, which is a base layer for the conductive layers of the display panel 100, may not have too large a thickness to reduce the resistance of the wiring(s) including the first metal layer ML1. For example, the first thickness TH1 of the first metal layer ML1 may be at least 1000 Å and less than half the second thickness TH2 of the second metal layer ML2. The first thickness TH1 of the first metal layer ML1 may be 1000 Å to 2500 Å.

The third metal layer ML3, which is an upper layer or a capping layer for the conductive layers of the display panel 100, may have a relatively small thickness. The third metal layer ML3 does not form a detour path for a current and may have a small thickness to minimize its diffusion into the second metal layer ML2 due to heat generated from a laser curing process. For example, the third thickness TH3 of the third metal layer ML3 may be 1/10 of the second thickness TH2 of the second metal layer ML2. For example, when the second thickness TH2 of the second metal layer ML2 is 2000 Å to 5000 Å, the third metal layer ML3 may be 200 Å to 500 Å. However, when the third metal layer ML3 includes Ti, the third metal layer ML3 may have a much smaller thickness because Ti diffuses better than V into the second metal layer ML2. For example, when the third metal layer ML3 includes Ti, the third thickness TH3 may be 300 Å or less.

The lower metal layer BML and the first pad wire PW1 of the first conductive layer may include the first, second, and third metal layers ML1, ML2, and ML3, the first metal layer ML1 may include V, the second metal layer ML2 may include Al or an Al alloy, and the third metal layer ML3 may include V or Ti. The gate electrode GE and the second pad wire PW2 of the second conductive layer and the capacitor electrode CPE of the third conductive layer, unlike the first conductive layer, may be formed of a single layer, and the second conductive layer may include Mo. However, the present disclosure is not limited to this. In some embodiments, the gate electrode GE and the second pad wire PW2 of the second conductive layer and the capacitor electrode CPE of the third conductive layer, similar to the first conductive layer, may also include the first, second, and third metal layers ML1, ML2, and ML3, which include V, Al or an Al alloy, and V or Ti, respectively.

The connection electrodes (CNE1 and CNE2) of the fourth and fifth conductive layers, unlike the first through third conductive layers, have a relatively large wiring width, and thus, wiring disconnections may not easily occur even when some wirings are lost during a laser curing process. Accordingly, even when the connection electrodes (CNE1 and CNE2) of the fourth and fifth conductive layers include the first, second, and third metal layers ML1, ML2, and ML3, no detour paths may be needed even in case of the loss of the main layer. The connection electrodes (CNE1 and CNE2) of the fourth and fifth conductive layers, similar to the first conductive layer, may include the first, second, and third metal layers ML1, ML2, and ML3, but the material of the first metal layer ML1 may differ from the connection electrodes (CNE1 and CNE2) of the fourth and fifth conductive layers to the first conductive layer. For example, in the connection electrodes (CNE1 and CNE2) of the fourth and fifth conductive layers, the first and third metal layers ML1 and ML3 may include Ti, and the second metal layer ML2 may include Al or an Al alloy.

Display devices according to other embodiments of the present disclosure will hereinafter be described.

Figure 10:
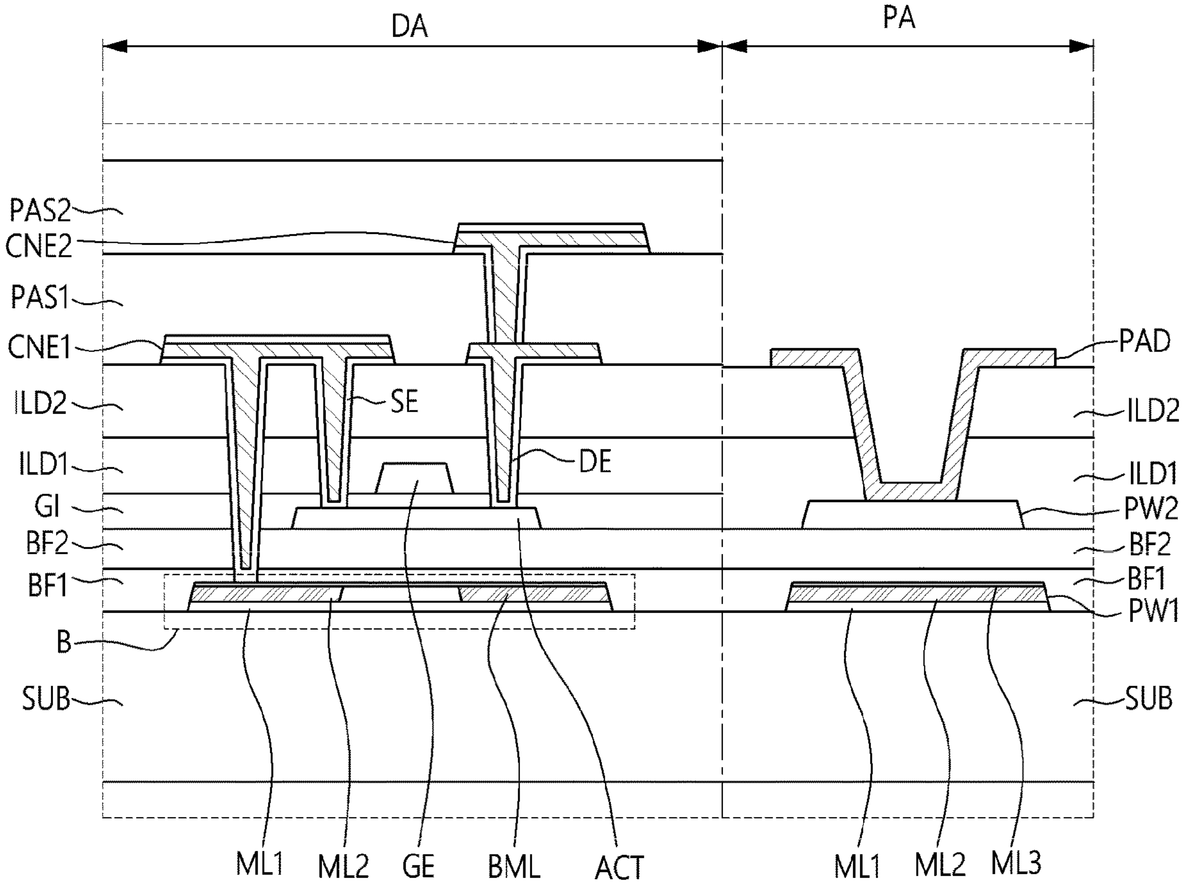
FIG. 10 is a cross-sectional view illustrating a plurality of conductive layers disposed in a display device according to another embodiment of the present disclosure.
Figure 11:
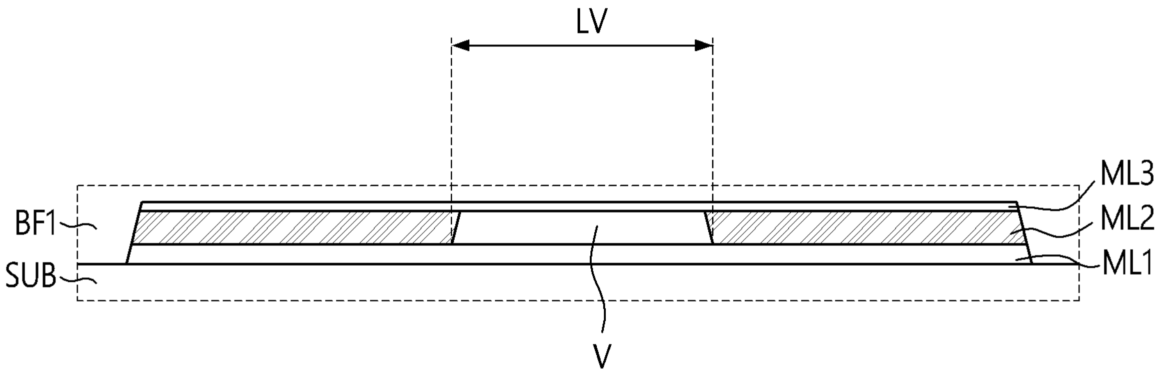
FIG. 11 is an enlarged cross-sectional view of part B of FIG. 10.

FIG. 10 is a cross-sectional view illustrating a plurality of conductive layers disposed in a display device according to another embodiment of the present disclosure. FIG. 11 is an enlarged cross-sectional view of part B of FIG. 10.

Referring to FIGS. 10 and 11, a conductive layer including a plurality of metal layers (ML1, ML2, and ML3) may include a void V in a region LV, from which part of a second metal layer ML2 has been lost. For example, a lower metal layer BML, which corresponds to a first conductive layer, may include the void V, which is formed due to the removal of part of the second metal layer ML2.

As already mentioned above, a laser curing process curing a sealing member 900 may be performed, and as the first conductive layer is subjected to a high-temperature environment during the laser curing process, part of the second metal layer ML2, which includes a metal with a low or suitable melting point, may melt away. In the lower metal layer BML of the first conductive layer, the void V may be formed between the first and third metal layers ML1 and ML3, and a current flowing along the second metal layer ML2 may flow into the first metal layer ML1, making a detour around the void V.

The lower metal layer BML of the first conductive layer may include vanadium (V), which has a low or suitable resistance, and thus, even though the void V is formed due to the removal of the second metal layer ML2, the resistance of the first conductive layer may not increase significantly. In some embodiments, the void V may have a width of 5.0 μm to 20.0 μm, and the resistance of the first conductive layer may change by about 0.2% to about 0.6%. As the first conductive layer includes a detour path for a current via the first metal layer ML1, even when the second metal layer ML2 is removed during a laser curing process, there may be no significant resistance variation, even in the presence of the void V, and wiring defects can be reduced.

Figure 12:
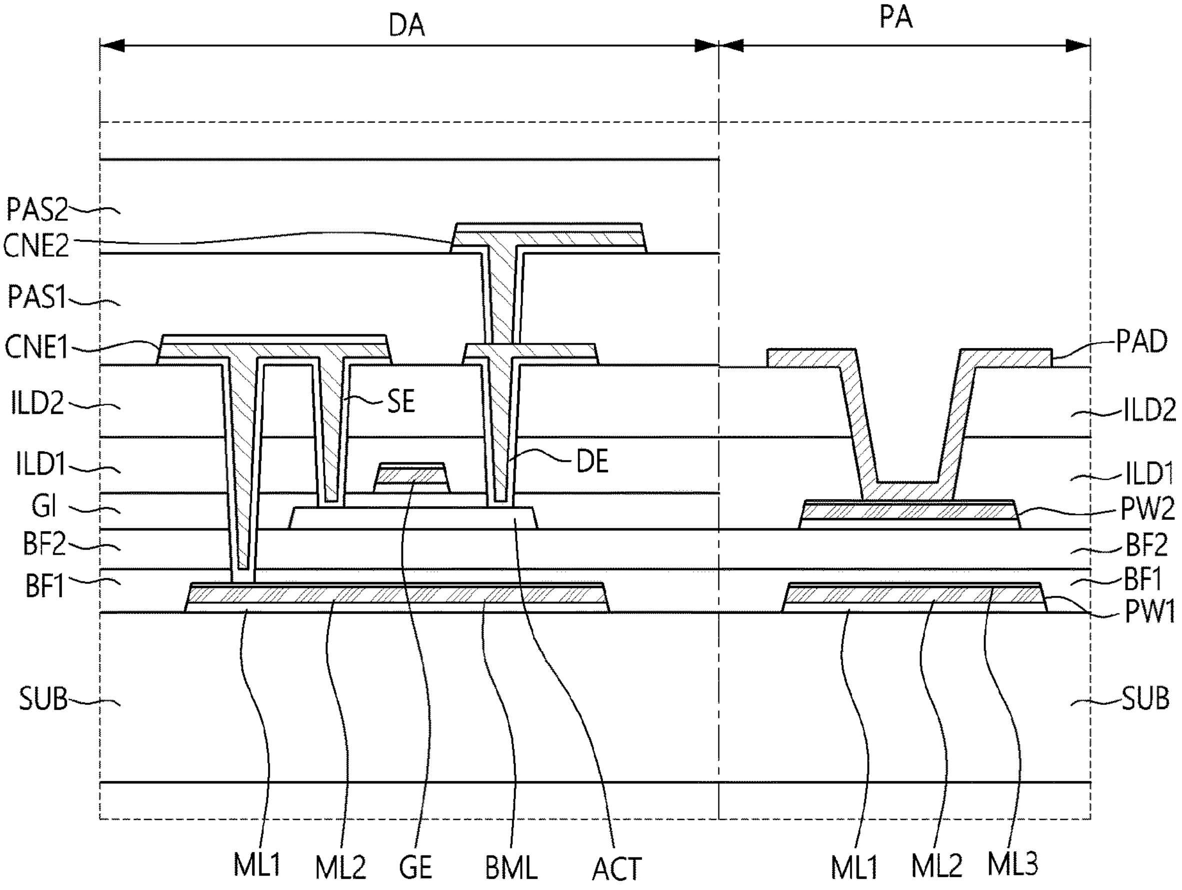
FIG. 12 is a cross-sectional view illustrating a plurality of conductive layers disposed in a display device according to another embodiment of the present disclosure.

FIG. 12 is a cross-sectional view illustrating a plurality of conductive layers disposed in a display device according to another embodiment of the present disclosure.

Referring to FIG. 12, a gate electrode GE and a second pad wire PW2 of a second conductive layer, similar to a lower metal layer BML of a first conductive layer, may have a structure in which a plurality of first, second, and third metal layers ML1, ML2, and ML3 are stacked. For example, in the gate electrode GE and the second pad wire PW2 of the second conductive layer, the first metal layer ML1 may include vanadium (V), the second metal layer ML2 may include Al or an Al alloy, and the third metal layer ML3 may include Ti. In some embodiments, a capacitor electrode CPE of a third conductive layer, similar to the lower metal layer BML of the first conductive layer, may have a structure in which the first, second, and third metal layers ML1, ML2, and ML3 are stacked. According to the embodiment of FIG. 12, even the second and third conductive layers have a structure capable of preventing or reducing the loss of wirings and the occurrence of wiring defects. The first, second, and third metal layers ML1, ML2, and ML3 in each of the second and third conductive layers are substantially the same as already described above, and thus, detailed descriptions thereof will be omitted.

As used herein, the term “and/or” includes any and all combinations of one or more of the associated listed items. Throughout the disclosure, the expression “at least one of a, b or c”, “at least one selected from a, b, and c”, “at least one selected from the group consisting of a, b, and c”, “at least one from among a, b, and c”, etc., indicates only a, only b, only c, both (e.g., simultaneously) a and b, both (e.g., simultaneously) a and c, both (e.g., simultaneously) b and c, all of a, b, and c, or variations thereof.

The use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device, and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

In concluding the detailed description, those skilled in the art will appreciate that many suitable variations and modifications can be made to the embodiments within the spirit and scope of the present disclosure as hereinafter claimed and equivalents thereof. Therefore, the disclosed embodiments of the present disclosure are used in a generic and descriptive sense only and not for purposes of limitation.

What is claimed is:

1. A display device comprising:

a substrate including a display area and a pad area on one side of the display area;

a plurality of conductive layers on the substrate, and in the display area and the pad area;

a passivation layer on the conductive layers; and a plurality of light-emitting elements on the passivation layer and in the display area, the plurality of light-emitting elements being spaced apart from one another, wherein at least one of the conductive layers comprises a first metal layer, a second metal layer on the first metal layer, and a third metal layer on the second metal layer in both the display area and the pad area, the first metal layer comprises vanadium (V), the second metal layer comprises aluminum (Al) or an Al alloy, and the third metal layer comprises V or titanium (Ti).

2. A display device comprising:

a substrate including a display area and a pad area on one side of the display area;

a plurality of conductive layers on the substrate, and in the display area and the pad area;

a passivation layer on the conductive layers; and a plurality of light-emitting elements on the passivation layer and in the display area, the plurality of light-emitting elements being spaced apart from one another wherein at least one of the conductive layers comprises a first metal layer, a second metal layer on the first metal layer, and a third metal layer on the second metal layer, the first metal layer comprises vanadium (V), the second metal layer comprises aluminum (Al) or an Al alloy, the third metal layer comprises V or titanium (Ti), a thickness of the second metal layer is greater than a thickness of the first metal layer and a thickness of the third metal layer, and the thickness of the first metal layer is greater than the thickness of the third metal layer.

3. The display device of claim 2, wherein the thickness of the first metal layer is from 1000 Å to half the thickness of the second metal layer.

4. The display device of claim 2, wherein the thickness of the second metal layer is 2000 Å to 5000 Å, and the thickness of the first metal layer is 1000 Å to 2500 Å.

5. The display device of claim 2, wherein the thickness of the third metal layer is 1/10 of the thickness of the second metal layer.

6. The display device of claim 2, wherein the thickness of the second metal layer is 2000 Å to 5000 Å, and the thickness of the third metal layer is 200 Å to 500 Å.

7. The display device of claim 2, wherein the thickness of the second metal layer is 2000 Å to 5000 Å, the third metal layer comprises Ti, and the thickness of the third metal layer is 200 Å to 500 Å.

8. The display device of claim 1, wherein the at least one of the conductive layers includes a void between the first metal layer and the third metal layer due to removal of part of the second metal layer therefrom.

9. The display device of claim 8, wherein a width of the void is 5.0 μm to 20.0 μm.

10. The display device of claim 1, wherein the second metal layer comprises an aluminum (Al)-nickel (Ni)-lanthanum (La) alloy, and the Al—Ni—La alloy has a total Ni—La content of 0.1 at % or less based on a total atomic composition of the Al—Ni—La alloy.

11. The display device of claim 1, further comprising:

a first conductive layer on the substrate;

a buffer layer on the first conductive layer;

a semiconductor layer on the buffer layer;

a gate insulating layer on the semiconductor layer;

a second conductive layer on the gate insulating layer;

an interlayer insulating layer on the second conductive layer; and a third conductive layer between the interlayer insulating layer and the passivation layer, wherein the first conductive layer comprises the first, second, and third metal layers.

12. The display device of claim 11, wherein the second conductive layer comprises the first, second, and third metal layers.

13. The display device of claim 11, wherein the third conductive layer comprises a base layer comprising Ti, a middle layer on the base layer and comprising Al or an Al alloy, and an upper layer on the middle layer and comprising Ti.

14. The display device of claim 11, further comprising:

a first pad wire in the pad area and in the same layer as the first conductive layer; and a second pad wire on the first pad wire and in the same layer as the second conductive layer.

15. The display device of claim 14, wherein at least one of the first pad wire or the second pad wire comprises the first, second, and third metal layers.

16. A display device comprising:

a substrate including a display area and a pad area on one side of the display area;

a first conductive layer on the substrate and comprising a lower metal layer in the display area and a first pad wire in the pad area;

a buffer layer on the first conductive layer;

a semiconductor layer on the buffer layer and overlapping with the lower metal layer in the display area;

a gate insulating layer on the semiconductor layer and the buffer layer;

a second conductive layer on the gate insulating layer and comprising a gate electrode overlapping with the semiconductor layer and in the display area, and a second pad wire overlapping with the first pad wire and in the pad area;

a first interlayer insulating layer on the second conductive layer;

a third conductive layer on the first interlayer insulating layer and comprising a capacitor electrode overlapping with the gate electrode and in the display area;

a second interlayer insulating layer on the third conductive layer;

a fourth conductive layer on the second interlayer insulating layer and comprising a first connection electrode connected to the semiconductor layer and the lower metal layer, and in the display area;

a passivation layer on the fourth conductive layer; and a plurality of light-emitting elements on the passivation layer and spaced apart from one another, wherein both the lower metal layer and the first pad wire of the first conductive layer comprise a first metal layer comprising vanadium (V), a second metal layer on the first metal layer and comprising aluminum (Al) or an Al alloy, and a third metal layer on the second metal layer and comprising V or titanium (Ti).

17. The display device of claim 16, wherein a thickness of the second metal layer is greater than a thickness of the first metal layer and a thickness of the third metal layer, and the thickness of the first metal layer is greater than the thickness of the third metal layer.

18. The display device of claim 17, wherein the thickness of the first metal layer is from 1000 Å to half the thickness of the second metal layer, and the thickness of the third metal layer is 1/10 of the thickness of the second metal layer.

19. The display device of claim 16, wherein at least one of the second conductive layer or the third conductive layer comprises the first, second, and third metal layers.

20. The display device of claim 16, wherein the fourth conductive layer comprises a base layer comprising Ti, a middle layer on the base layer and comprising Al or an Al alloy, and an upper layer on the middle layer and comprising Ti.

* * * * *